United States Patent [19]

Murotani

[11] Patent Number: 4,875,194

[45] Date of Patent: Oct. 17, 1989

[54] SEMICONDUCTOR MEMORY DEVICE WITH PROTECTION CELLS

[75] Inventor: Tatsunori Murotani, Tokyo, Japan

[73] Assignee: NEC Corporation, Tokyo, Japan

[21] Appl. No.: 160,982

[22] Filed: Feb. 26, 1988

[30] Foreign Application Priority Data

Feb. 26, 1987 [JP] Japan .................................. 62-44296

[51] Int. Cl.⁴ ................................................ G11C 7/02
[52] U.S. Cl. ..................................... 365/210; 365/203
[58] Field of Search ................ 365/210, 203, 190, 189

[56] References Cited

U.S. PATENT DOCUMENTS 4,435,793  3/1984  Ochii ............................... 365/210 X Primary Examiner—Joseph A. Popek
Attorney, Agent, or Firm—Sughrue, Mion, Zinn, Macpeak & Seas

[57] ABSTRACT

For preventing sense amplifier circuits associated with memory cells from misjudgment, there is proposed a semiconductor memory device comprising protection cells formed between memory cell array and peripheral circuits, and the protection cells are coupled to an additional bit line pair precharged to a predetermined voltage level approximately equal to those of bit line pairs coupled to the memory cells, so that no difference voltage takes place between the additional bit line pair and the neighboring bit line pair, thereby eliminating a difference in characteristics of the sense amplifier circuits coupled thereto.

8 Claims, 1 Drawing Sheet

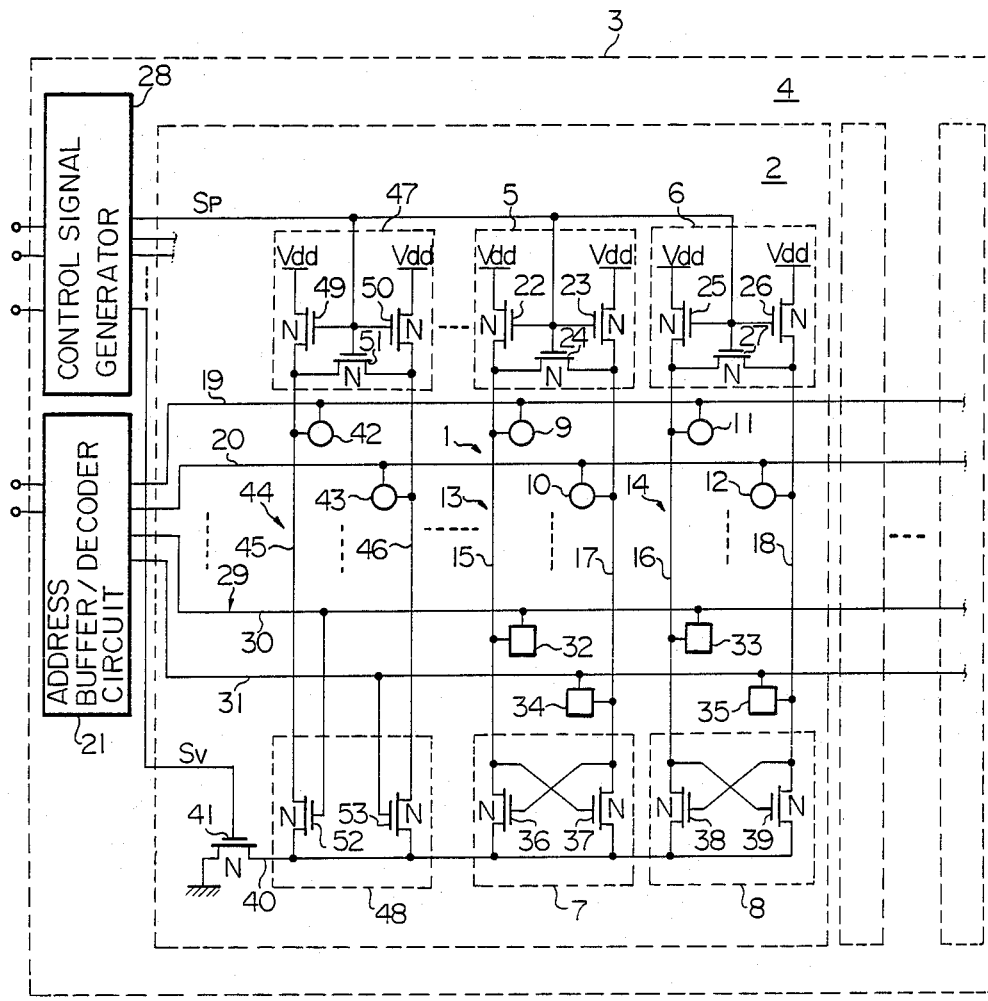

SEMICONDUCTOR MEMORY DEVICE WITH PROTECTION CELLS

FIELD OF THE INVENTION

This invention relates to a semiconductor memory device and, more particularly, to protection cells for protecting data informations preserved in memory cells against destruction.

BACKGROUND OF THE INVENTION

In general, a dynamic type semiconductor memory device is arranged to have a memory cell array located at a central zone of a semiconductor chip and peripheral circuits such as, for example, a data input/output buffer circuit and an address buffer/decoder circuit formed in a peripheral zone of the semiconductor chip. The dynamic type semiconductor memory device thus arranged is responsive to address signals accompanied by some control signals to preserve or retrieve data informations into or from the memory cell array. In these operations, the peripheral circuits are activated to assist the memory cell array accompanied by a plurality of sense amplifier circuits, so that electric charges discharged from the peripheral circuits flows into the semiconductor chip during those operations. On the other hand, the data informations are preserved in the form of electric charges, then the data informations are liable to be affected by the electric charges discharged from the peripheral circuits. In a serious situation, some of the data informations are inverted in logic level.

The minimum device dimension has been reduced on the basis of recent research and development efforts, and, accordingly, the amount of charges accumulated in each memory cell is decreased with the minimization of the device size. Then, the problem of inversion is more crucial. One of the solutions is to provide additional memory cells along the peripheral circuits. The additional memory cells are coupled to a pair of bit lines and the bit lines are directly supplied from a source of voltage. This means that the potential on the bit line pair coupled to the additional memory cells tends to be different from the bit line pair coupled to the memory cells of the memory cell array.

However, another problem is encountered in the proposed dynamic type semiconductor memory device in operation of the sense amplifier circuits. In detail, the minimization of the device size results in reduction of a distance between the neighboring bit line pairs. Then, a bit line pair is capacitively coupled to the neighboring bit line pairs, so that each of the bit line pair tends to be influenced by the neighboring bit line pairs, especially, the potentials on the neighboring bit line pairs. Under the influence of the neighboring bit line pairs, the sense amplifier circuits are also affected by the potentials on the neighboring bit line pairs. As a result, if a bit line pair does not neighbor the bit line pair coupled to the additional memory cells, the sense amplifier circuit is not under the influence of the difference between the neighboring bit line pairs. On the other hand, if a bit line pair neighbors the bit line pair coupled to the additional memory cells, the sense amplifier circuit operates with a characteristic different from that of the sense amplifier circuit which is free from the influence of the different potential.

SUMMARY OF THE INVENTION

It is therefore an important object of the present invention to provide a semiconductor memory device with protection cells which is suitable for high density integration.

It is also an important object of the present invention to provide a semiconductor memory device which is free from the problem inherent in the prior-art semiconductor memory device.

To accomplish these objects, the present invention proposes to preserve a dummy information approximately equal in voltage level to the data information into each of the protection cells.

In accordance with the present invention, there is provided a semiconductor memory device fabricated on a semiconductor substrate comprising, (a) a memory cell array having a plurality of memory cells each capable of preserving a data information in the form of electric charges, the memory cells having arranged in rows and columns, (b) a plurality of bit line pairs each associated with the memory cells in two of the columns and having first and second bit lines coupled to the memory cells in aforesaid two of the columns, respectively, (c) charging means operative to supply each of the bit line pairs with electric charges for equalizing the first bit line to the second bit line, (d) a plurality of word lines each coupled to the memory cells in each row, (e) reference means operative to supply the first bit lines or the second bit lines with a reference information upon activation thereof, (f) peripheral circuits including an addressing circuit operative to activate the reference means, the addressing circuit being operative to activate one of the word lines so as to allow the memory cells coupled thereto to be electrically connected to the second bit lines or the first bit lines for transferring the data informations, a difference voltage taking place between the first and the bit lines of each bit line pair on the basis of the data information and the reference information, (g) a plurality of sense amplifier circuits each associated with each of the bit line pairs and operative to decide a logic level of the data information on the basis of the difference voltage between the first and second bit lines of each bit line pair when the sense amplifier circuit is activated, (h) interconnecting means operative to couple the sense amplifier circuits to a constant voltage source for activation of the sense amplifier circuits; and (i) protection cells located between the peripheral circuits and the memory cell array and capable of preserving dummy informations each in the form of electric charges, the protection cells being coupled to one of the bit line pairs, one of the sense amplifier circuits associated with aforesaid one of the bit line pairs being directly controlled by the addressing circuit when the addressing means activate the reference means and aforesaid one of the word lines.

The data information may have a high voltage level or a low voltage level, and, accordingly, the reference information may have a voltage level between the high voltage level and the low voltage level. The reference means may comprise a plurality of dummy cells each coupled to the first or second bit line of each bit line pair coupled to the memory cells in each column, and each of the dummy cells may be operative to produce the reference information. Each of the sense amplifier circuits associated with the bit line pair coupled to the memory cells in each column may comprise first and second n-channel type field effect transistors, the first n-channel type field effect transistor has a gate electrode coupled to a drain node of the second n-channel type field effect transistor, and the second n-channel type field effect transistor has a gate electrode coupled to a drain node of the first n-channel type field effect transistor, but emitter nodes of the first and second n-channel type field effect transistors are coupled to the interconnecting means.

In order to activate the reference means, the semiconductor memory device further may further comprise a dummy word line pair having first and second dummy word lines, and the first and second dummy word lines interconnect the addressing circuit and the dummy cells. For direct controlling of the sense amplifier circuit associated with the bit line pair coupled to the protection cells, another implementation has may be arranged to have the sense amplifier circuit provided with third and fourth n-channel type field effect transistors, and the third and fourth n-channel type field effect transistors have respective gate electrodes coupled to the first and second dummy word lines, respectively.

BRIEF DESCRIPTION OF THE DRAWINGS

The features and advantages of a semiconductor memory device with protection cells according to the present invention will be more clearly understood from the following description taken in conjunction with the accompanying drawing in which figure is a circuit diagram showing the circuit arrangement of a semiconductor memory device embodying the present invention.

DESCRIPTION OF THE PREFERRED EMBODIMENT

In the figure, there is shown a part of the circuit arrangement of a semiconductor memory device embodying the present invention. The semiconductor memory device is of the dynamic type and fabricated on a semiconductor substrate, typically mono-crystalline silicon substrate. The semiconductor memory device largely comprises a memory cell array 1 formed in a central zone 2 of the semiconductor substrate 3 and a peripheral circuits located in the peripheral zone 4 of the semiconductor substrate 3. In this instance, the memory cell array 1 is accompanied by precharging circuits 5 and 6 and sense amplifier circuits 7 and 8, so that these circuits, 5, 6, 7 and 8 are also formed in the central zone, however the precharging circuits and sense amplifier circuits may be formed in the peripheral zone 4 in another implementation.

The memory cell array comprises a plurality of memory cells 9, 10, 11 and 12 arranged in rows and columns, but only two rows and two columns are illustrated in the figure, so that description will be made for the two rows and the four columns associated with the precharging circuits 5 and 6 and the sense amplifier circuits 7 and 8, but this description does not mean that the memory cell array 1 has a small number of memory cells only. The memory cell array 1 is accompanied by a plurality of bit lie pairs 13 and 14, and each of the bit line pairs 13 and 14 extends in column directions. Each bit line pair 13 or 14 has a first bit line 15 or 16 and a second bit line 17 or 18, and interconnects the precharging circuit 5 or 6 and the sense amplifier circuit 7 or 8. The first bit lines 15 and 16 are coupled to the memory cells 9 and 11 in every two columns, and the second bit lines 17 and 18 are coupled to the memory cells 10 and 12 in the other columns. Through not shown in the drawings, each of the memory cells 9 to 12 has a series of an n-channel field-effect type switching transistor and a capacitor coupled between the first or second bit line and the ground, so that a data information is preserved in the memory cell 9, 10, 11 or 12 in the form of electric charges. In this instance the data information has a positive high voltage level or the ground level depending upon a logic level thereof. Reference numerals 19 and 20 designate two of word lines extending in row directions, and each of the word lines 19 and 20 are coupled to the gate electrodes of the n-channel field-effect type switching transistors of the memory cells 9 and 11, or 10 and 12 in each row. The word lines 19 and 20 are coupled at one ends thereof to a address buffer/decoder circuit 21 forming part of the peripheral circuits, and the address buffer/decoder circuit 21 is capable of activating one of the word lines 19 and 20 in response to an address signal supplied from the outside thereof. Namely, the address buffer/decoder circuit 21 allows one of the word lines, for example the word line 19, to go up to a positive high voltage level, the respective switching transistors of the memory cells 9 and 11 turn on to provide conduction paths between the capacitors and the first bit lines 15 and 16, respectively.

Each of the precharging circuits 5 and 6 comprises three n-channel field-effect type transistors 22, 23 and 24, or 25, 26 or 27, and the n-channel field-effect type transistors 22 or 25 is capable of providing a conduction path between a source of positive high voltage Vdd and the first bit line 15 or 16. On the other hand, the n-channel field-effect type transistor 23 or 26 is capable of providing a conduction path between the source of positive high voltage Vdd and the second bit line 17 or 18, but the n-channel field-effect type transistor 24 or 27 can provide a conduction path between the first bit line 15 or 16 and the second bit line 17 or 18 for equalizing in voltage level. All of the n-channel field-effect type transistors 22 to 27 have respective gate electrodes commonly coupled to one of output nodes of a control signal generator circuit 28 which also forms part of the peripheral circuits. When the control signal generator circuit 28 produces a precharging signal Sp of the positive high voltage level in response to external control signals fed from the outside thereof, all of the n-channel field-effect type transistors 22 to 27 turn on to charge up the first and second bit lines 15 to 18 of the bit line pairs 13 and 14.

The semiconductor memory device illustrated in the figure further comprises a dummy word line pair 29 provided with first and second dummy word lines 30 and 31, and the dummy word lines 30 and 31 extend in parallel to the word lines 19 and 20. The first dummy word line 30 is coupled to dummy cells 32 and 33, and the dummy cells 32 and 33 provide a reference voltage level between the positive high voltage level and the ground level to the first bit lines 15 and 16 when the address buffer/decoder circuit 21 allows the first dummy word line 30 to go up to the positive high voltage level. Similarly, the second dummy word line 31 is coupled to dummy cells 34 and 35, and the dummy cells 34 and 35 provide the reference voltage level to the second bit lines 17 and 18 when the address buffer/decoder circuit 21 allows the second dummy word line 31 to go up to the positive high voltage level. The address decoder circuit 21 complementarily provides the positive high voltage level to the first word line 19 and the second dummy word line 31 or the second word line 20 and the first dummy word line 29, so that a difference voltage takes place between the first and second bit lines of each bit line pair 13 or 14.

Each of the sense amplifier circuits 7 and 8 comprises first and second n-channel field-effect type transistors 36 and 37, or 38 and 39. The first n-channel field-effect type transistors 36 and 38 have respective gate electrodes coupled to drain nodes of the second n-channel field-effect type transistors 37 and 39, respectively, and, similarly, the second n-channel field-effect type transistors 37 and 39 have respective gate electrodes coupled to drain nodes of the first n-channel field-effect type transistors 36 and 38, respectively. The drain nodes of the first n-channel field-effect type transistors 36 and 38 are coupled to the first bit lines 15 and 16, respectively, but the drain nodes of the second n-channel field-effect type transistors 37 and 39 are coupled to the second bit lines 17 and 18, respectively. However, all of the source nodes of the transistors 36 to 39 are commonly coupled to a shared discharge line 40, and the shared discharge line 40 is coupled the ground when an n-channel field-effect type transistor 41 is turned on. Namely, the n-channel field-effect type transistor 41 has a gate electrode coupled to another output node of the control signal generator circuit 28, and the control signal generator circuit 28 produces an activation signal Sv of the positive high voltage level which is supplied to the gate electrode of the n-channel field-effect type transistor 41. Then, with the activation signal Sv, the n-channel field-effect type transistor 41 turns on, thereby activating the sense amplifier circuits 7 and 8.

The semiconductor memory device illustrated in the figure further comprises protection cells each similar in construction to the memory cells 9 to 12, so that no further description is incorporated for the construction of each protection cell. Each of the protection cells thus arranged is capable of preserving a dummy information in the form of electric charges which may be attacked by the electric charges discharged from the peripheral circuits into the semiconductor substrate 3. However, the dummy information is not read out to the outside thereof, so that no inversion is detected from the outside thereof. Moreover, the electric charges fed into the semiconductor substrate 3 are consumed by the attacked on the dummy informations, so that data informations in the memory cells are protected from the electric charges fed into the semiconductor substrate 3. Only two of the protection cells are shown in the drawing and are designated by reference numerals 42 and 43, respectively. Moreover, the figure shows the protection cells 42 and 43 located between the left side of the memory cell array 1 and the peripheral circuits, however there are formed protection cells between the right side of the memory cell array 1 and the peripheral circuits. On both sides of the protection cells 42 and 43 is provided an additional bit line pair 44 which has first and second additional bit lines 45 and 46 both extending in parallel to the bit line pairs 13 and 14. The additional bit line pair 44 interconnects an additional precharging circuit 47 and an additional sense amplifier circuit 48, and the protection cells 42 and 43 are coupled to the first and second additional bit lines 45 and 46, respectively.

The additional precharging circuit 47 is similar in construction to the precharging circuits 5 and 6, and comprises three n-channel field-effect type transistors 49, 50 and 51 with gate electrodes commonly coupled to aforesaid output node of the control signal generator circuit 28 where the precharging signal Sp appears. However, the additional sense amplifier circuit 48 is slightly different in construction from the sense amplifier circuits 7 and 8. Namely, the additional sense amplifier circuit 48 comprises third and fourth n-channel field-effect type transistors 52 and 53, and the third and fourth n-channel field-effect type transistors 52 and 53 have respective gate electrodes coupled in parallel to the first and second dummy word lines 30 and 31, respectively. Drain nodes of the third and fourth n-channel field-effect type transistors 52 and 53 are coupled to the additional bit lines 45 and 46, respectively, but source nodes thereof are commonly coupled to the shared discharge line 40.

Description will be hereinunder made for a read-out operation on the assumption that an external device such as, for example, accesses the data information preserved in the memory cell 9. The control signal generator circuit 28 produces the precharging signal Sp of the positive high voltage level, and the precharging signal Sp is supplied to not only the precharging circuits 5 and 6 but also the additional precharging circuit 47. With the precharging signal Sp, all of the precharging circuits 5 and 6 and the additional precharging circuit 47 are activated to charge up the bit line pairs 13 and 14 and the additional bit line pair 44. After completion of the precharging operation, the control signal generator circuit 28 shifts the precharging signal Sp from the positive high voltage level to the ground level, so that the bit line pairs 13 and 14 and the additional bit line pair 47 are cut off from the source of positive high voltage Vdd.

When the bit line pairs 13 and 14 and the additional bit line pair 47 are cut off from the source of positive high voltage, the address buffer/decoder circuit 21 allows the word line 19 and the dummy word line 31 to go up to the positive high voltage level, then the memory cells 9 and 11 and the dummy cells 34 and 35 are activated to transfer the data informations and the dummy informations preserved therein to the first bit lines 15 and 16 and the second bit lines 17 and 18, respectively. As described hereinbefore, the dummy information has the intermediate voltage level between the positive high voltage level and the ground level, so that a small difference in voltage level takes place between the first and second bit lines 15 and 17 and between the first and second bit lines 16 and 18, respectively. On the other hand, the n-channel field-effect type transistors 52 and 53 are turned off and on, respectively, due to the voltage level of the dummy word lines 30 and 31.

Subsequently, the control signal generator circuit 28 produces the activation signal Sv of the positive high voltage level which is supplied to the gate electrode of the n-channel field-effect type transistor 41. Then, the n-channel field-effect type transistor 41 turns on to allow the shared discharge line 40 to be grounded. When the shared discharge line 40 is grounded, the sense amplifier circuits 7 and 8 are activated to increase the differences between the first and second bit lines 15 and 17 and between the first and second bit lines 16 and 18, respectively. Though not shown in the drawings, one of the differences on the bit line pairs 13 and 14 is selected by a suitable selector circuit and, thereafter, transferred to a output buffer circuit 8 (not shown). On the other hand, the additional bit line 46 is coupled to the shared discharge line 40 through the n-channel field-effect type transistor 53, however the additional bit line 45 remains in the positive high voltage level because the n-channel field-effect type transistor 52 is turned off. For this reason, the protection cell 42 accumulates the electric charges fed from the additional bit line 44. However, the additional bit line 45 goes up to the predetermined positive high voltage level equal to the bit line pairs 13 and 14, so that no unbalance in voltage level takes place between the bit line pair 13 and the additional bit line pair 44, so that the sense amplifier circuit 7 is prevented from the undesirable operation.

In the embodiment hereinbefore described, the protection cells 42 and 43 and the additional precharging circuit 47 are similar in construction to the memory cells 9 to 12 and the precharging circuits 5 and 6, so that no additional process is needed to form the protection cells and the additional precharging circuit 47 on the semiconductor substrate 3.

As will be understood from the foregoing description, the semiconductor memory device according to the present invention is advangageous over the prior-art semiconductor memory device in that all of the sense amplifier circuits operate with the same characteristics regardless of the position thereof.

In the embodiment described above, each of the bit line pairs 13 and 14 is associated with two of the columns, and the words "bit line pair" is used in view of precharging circuit, but it is possible to say that each bit line is associated with each column in view of addressing.

Although particular embodiment of the present invention have been shown and described, it will be obvious to those skilled in the art that various changes and modifications may be made without departing from the spirit and scope of the present invention.

What is claimed is:

1. A semiconductor memory device fabricated on a semiconductor substrate, comprising:
   (a) a memory cell array having a plurality of memory cells each capable of preserving a data information in the form of electric charges, said memory cells being arranged in rows and columns;
   (b) a plurality of bit line pairs each associated with said memory cells in two of said columns and having first and second bit lines coupled to said memory cells in said two of said columns, respectively;
   (c) charging means operative to supply each of said bit line pairs with electric charges for equalizing said first bit line to said second bit line;
   (d) a plurality of word lines each coupled to said memory cells in each row;
   (e) reference means operative to supply said first bit lines or said second bit lines with a reference information upon activation thereof;
   (f) peripheral circuits including an addressing circuit operative to activate said reference means, said addressing circuit being operative to activate one of said word lines so as to allow said memory cells coupled thereto to be electrically connected to said second bit lines or said first bit lines for transferring said data information, a difference voltage taking place between said first and second bit lines of each bit line pair on the basis of said data information and said reference information;
   (g) a plurality of sense amplifier circuits each associated with each of said bit line pairs and operative to decide a logic level of said data information on the basis of said difference voltage between said first and second bit lines of each bit line pair when the sense amplifier circuit is activated;
   (h) interconnecting means operative to couple said sense amplifier circuits to a constant voltage source for activation of said sense amplifier circuits; and
   (i) protection cells located between said peripheral circuits and said memory cell array and capable of preserving dummy information each in the form of electric charges, said protection cells being coupled to one of said bit line pairs, one of said sense amplifier circuits associated with said one of said bit line pairs being directly controlled by said addressing circuit when said addressing circuit activate said reference means and said one of said word lines.

2. A semiconductor memory device as set forth in claim 1, in which said data information has a high voltage level or a low voltage level.

3. A semiconductor memory device as set forth in claim 2, in which said reference means comprise a plurality of dummy cells each coupled to the first or second bit line of each bit line pair coupled to said memory cells in each column, each of said dummy cells being operative to produce said reference information with a voltage level between said high voltage level and said low voltage level.

4. A semiconductor memory device as set forth in claim 3, in which each of said sense amplifier circuits associated with said bit line pair coupled to said memory cells in each column comprises first and second n-channel type field effect transistors, said first n-channel type field effect transistor having a gate electrode coupled to a drain node of said second n-channel type field effect transistor, said second n-channel type field effect transistor having a gate electrode coupled to a drain node of said first n-channel type field effect transistor, source nodes of said first and second n-channel type field effect transistors being coupled to said interconnecting means.

5. A semiconductor memory device as set forth in claim 4, in which said semiconductor memory device further comprises a dummy word line pair having first and second dummy word lines, said first and second dummy word lines interconnecting said addressing circuit and said dummy cells.

6. A semiconductor memory device as set forth in claim 5, in which said one of said sense amplifier circuits comprises third and fourth n-channel type field effect transistors having respective gate electrodes coupled in parallel to said first and second dummy word lines, respectively.

7. A semiconductor memory device as set forth in claim 6, in which said addressing circuit selectively provides one of said first and second dummy word lines with the high voltage level.

8. A semiconductor memory device fabricated on a semiconductor substrate, comprising:
   (a) a memory cell array having a plurality of memory cells each capable of preserving a data information in the form of electric charges, said memory cells being arranged in rows and columns, said data information having a high voltage level or a low voltage level;
   (b) a plurality of bit line pairs each associated with said memory cells in two of said columns and having first and second bit lines coupled to said memory cells in said two of said columns, respectively;
   (c) precharging circuits each provided between a source of high voltage level and operative to charge up each of said bit line pairs to a predetermined high voltage level for equalizing said first bit line to said second bit line;

(d) a plurality of word lines each coupled to said memory cells in each row;

(e) a plurality of dummy cells each coupled to the first or second bit line coupled to said memory cells in each column, said dummy cells being operative to supply said first bit lines or said second bit lines with a reference voltage level between said high voltage level and said low voltage level upon activation thereof;

(f) a dummy word line pair having first and second dummy word lines, said first dummy word line being coupled to said dummy cells coupled to said first bit lines, said second dummy word line being coupled to said dummy cells coupled to said second bit lines;

(g) peripheral circuits including an addressing circuit operative to supply said first or second dummy word line with said high voltage level for activation of said dummy cells coupled to the first or second dummy word line, said addressing circuit being operative to activate one of said word lines so as to allow said memory cells coupled thereto to be electrically connected to said second bit lines or said first bit lines for transferring said data information, a difference voltage taking place between said first and second bit lines of each bit line pair on the basis of said data information and said reference voltage level;

(h) a plurality of sense amplifier circuits each associated with each of said bit line pairs and operative to decide a logic level of said data information on the basis of said difference voltage between said first and second bit lines of each bit line pair when the sense amplifier circuit is activated, each of said sense amplifier circuits having first and second n-channel type field effect transistors one of which has a gate electrode coupled to a drain node of the other of said first and second n-channel type field effect transistors and the other of which has a gate electrode coupled to a drain node of said one of said first and second n-channel type field effect transistors;

(i) interconnecting means operative to couple said sense amplifier circuits to a constant voltage source for activation of said sense amplifier circuits;

(j) protection cells located between said peripheral circuits and said memory cell array and capable of preserving dummy information each in the form of electric charges, said protection cells being coupled to an additional bit line pair; and (k) an additional sense amplifier circuit having third and fourth n-channel type field effect transistors with respective gate electrodes coupled in parallel to said first and second dummy word lines, drain nodes of said third and fourth n-channel type field effect transistors being coupled to said additional bit line pair, source nodes of said third and fourth n-channel type field effect transistors being coupled to said interconnecting means.

* * * * *

UNITED STATES PATENT AND TRADEMARK OFFICE
CERTIFICATE OF CORRECTION

PATENT NO. : 4,875,194

DATED : October 17, 1989

INVENTOR(S) : TATSUNORI MUROTANI

It is certified that error appears in the above-identified patent and that said Letters Patent is hereby corrected as shown below:

Column 2, line 20, delete "having" and insert therefor --being--.

Column 3, line 16, delete "has".

Column 3, line 59, delete "lie" and insert therefor --line--.

Signed and Sealed this

Eleventh Day of December, 1990

Attest:

HARRY F. MANBECK, JR.

*Attesting Officer*     *Commissioner of Patents and Trademarks*